US008825463B2

(12) United States Patent
Nomura et al.

(10) Patent No.: US 8,825,463 B2
(45) Date of Patent: Sep. 2, 2014

(54) LOGIC SIMULATION METHOD AND LOGIC SIMULATOR

(75) Inventors: Kenichi Nomura, Kawasaki (JP); Hideaki Anbutsu, Kawasaki (JP); Cheng Giam Tan, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 131 days.

(21) Appl. No.: 12/585,081

(22) Filed: Sep. 2, 2009

(65) Prior Publication Data

US 2009/0326902 A1 Dec. 31, 2009

Related U.S. Application Data (63) Continuation of application No. PCT/JP2007/055961, filed on Mar. 23, 2007.

(51) Int. Cl.
*G06F 17/50* (2006.01)
*G06G 7/62* (2006.01)

(52) U.S. Cl.
USPC .......................................................... 703/13

(58) Field of Classification Search
USPC .......................................................... 703/13
See application file for complete search history.

(56) References Cited

U.S. PATENT DOCUMENTS

2006/0208805 A1  9/2006  Galloway et al.

FOREIGN PATENT DOCUMENTS

| JP | 09-026985 | 1/1997 |
|---|---|---|
| JP | 2000-357179 | 12/2000 |
| JP | 2006-262489 | 9/2006 |

OTHER PUBLICATIONS

Bednar et al. "Issues and strategies for the physical design of system-on-a-chip ASICs", IBM 2002.*
Lanoo "A Mixed Digital-Analog Simulation and Test Environment", IEEE 1990.*
Patent Abstract of Japan, Japanese Publication No. 2006-262489, Published Sep. 28, 2006.
Patent Abstracts of Japan, Japanese Publication No. 09-026985, Published Jan. 1, 1997.
Patent Abstracts of Japan, Japanese Publication No. 2000-357179, Published Dec. 26, 2000.
International Search Report mailed Apr. 27, 2007 in corresponding PCT Application No. PCT/JP2007/055961.

* cited by examiner

*Primary Examiner* — Saif Alhija
(74) *Attorney, Agent, or Firm* — Fujitsu Patent Center (57) ABSTRACT

A logic simulation method includes causing a physical specification detector to detect physical specifications of an analog circuit (a PLL circuit and a DLL circuit) as a verification object described in a logic library; causing a monitor to monitor whether a signal or setting during a logic simulation satisfies the physical specifications; and causing a warning section to issue a warning when the signal or the setting fails to satisfy the physical specifications.

9 Claims, 11 Drawing Sheets

`timescale 1ps / 1ps module PLLV1(X, L, CK, FB, S);

//**** user's parameter ***// parameter ON_ALARM=1; // 1:Alarm on 0:Alarm off parameter LOCK_LIMIT=100; // ps parameter MIN_FREQ_X=1000; // KHz parameter MAX_FREQ_X=1600; // KHz parameter MIN_FREQ_CK=5; // KHz parameter MAX_FREQ_CK=200; // KHz //**** PLL developer parameter ***// parameter CK_MIN_DUTY=1500; // ps parameter FB_MIN_DUTY=1500; // ps parameter RST_Wtime=2000000; // ps parameter RST_Htime=2000000; // ps parameter MULTIPLY_MIN_SET=8; // multiply parameter MULTIPLY_MAX_SET=128; // multiply parameter CKDOWN_Wtime=200000; // ps parameter LOCK_PROTECT=100000; // ps parameter ABORT_COUNT=10000; // time

FIG. 5

//////// Setup Sequantial monitor //////// always @(negedge S or FB)

begin if(S==1'b0)  fb_event=1'b1;

else    fb_event=1'b0;

end always @(S)

begin if(S==1'b0) Seq_Wstatus=1'b0;

else if(reset_detected==1'b1)  #(SETUP_SEQUENTIAL) Seq_Wstatus=fb_event;

end

//////// Setup Sequantial monitor //////// always @(posedge Seq_Wstatus)

if(ON_ALARM==1'b1)

begin

$display("*************************************** Warning(%d set) ***************************************",set_no);

$display("################# W-101: Please refer to manual and check up starting sequence ################");

$display("Warning!!(Time:%d ps) : \'Setup Sequential disorder\'.  \'FB\' has no event over funtional time \'%d ps\' after \'S\' negated\n",$time,SETUP_SEQUENTIAL);

$fdisplay(fd1,"*************************************** Warning(%d set) ***************************************",set_no);

$fdisplay(fd1,"################# W-101: Please refer to manual and check up starting sequence ################");

$fdisplay(fd1,"Warning!!(Time:%d ps) : \'Setup Sequential disorder\'.  \'FB\' has no event over funtional time \'%d ps\' after \'S\' negated\n",$time,SETUP_SEQUENTIAL);

end

FIG. 6

WARNING EXAMPLES :

1********************************************* Warning( 10 set) *********************************************
########## W-101: Please refer to manual and check up starting sequence ################################
Warning!!(Time:   76529011 ps) : "Setup Sequential disorder". "FB" has no event over funtional time " 320000 ps" after "S" negated 2********************************************* Warning( 10 set) *********************************************
########## W-201: Please refer to manual and correct reset(S='0') timing width ################################
Warning!!(Time:   76209011 ps) : Reset(S=   200000 ps) time less than specification of PLL(  2000000 ps)

3********************************************* Warning( 15 set) *********************************************
########## W-201: Please refer to manual and correct function(S='1') timing width ################################
Warning!!(Time:  159876111 ps) : Funtioning time(S='H' :   142800 ps) is shorter than specification of PLL(  2000000 ps)

4********************************************* Warning( 12 set) *********************************************
########## W-501: Please refer to manual and correct input reference clock ################################
Warning!!(Time:  145686000 ps) : "CK DOWN". No event on incoming reference clock "CK" over   200000 ps 5********************************************* Warning( 14 set) *********************************************
########## W-301: Please refer to manual and correct Input Reference Clock ################################
Warning!!(Time:  159874154 ps) : frequency of incoming reference clock (CK=   700280 kHz) is out of specification( 5 MHz –   50 MHz)

6********************************************* Warning( 14 set) *********************************************
########## W-202: Please refer to manual and correct input reference clock(CK) pulse ################################
Warning!!(Time:  159874868 ps) : "H" pulse of incoming reference clock (CK=   714 ps) is out of specification( 1500 ps)

Related Art

FIG. 11

LOGIC SIMULATION METHOD AND LOGIC SIMULATOR

This application is a continuation application filed under 35 u.s.c. §111(a), of International Application PCT/JP2007/055961, filed in Japan on Mar. 23, 2007, and designated United States.

FIELD

The embodiments discussed herein are related to a logic simulation method and a logic simulator.

BACKGROUND

In recent years, an analog circuit such as a PLL circuit or a DLL circuit has been mounted on a chip.

The PLL circuit has a function of multiplying a clock frequency or performing a skew adjustment of a clock within an LSI (Large Scale Integrated circuit). The PLL circuit is an indispensable circuit for actualizing speed-up and scale-up of the LSI over the recent years.

The DLL circuit is an indispensable circuit for a DDR (Double Data Rate)-SDRAM (Synchronous Dynamic Random Access Memory). The DLL is used for generating an intended delay within the LSI.

A conventional method verifies operations of the PLL circuit or the DLL circuit as follows. Using a hardware description language such as Verilog, the PLL circuit or the DLL circuit is functionally described to perform a logic simulation (see, e.g., Japanese Laid-open Patent Publication No. 2000-357179).

Figure 8:
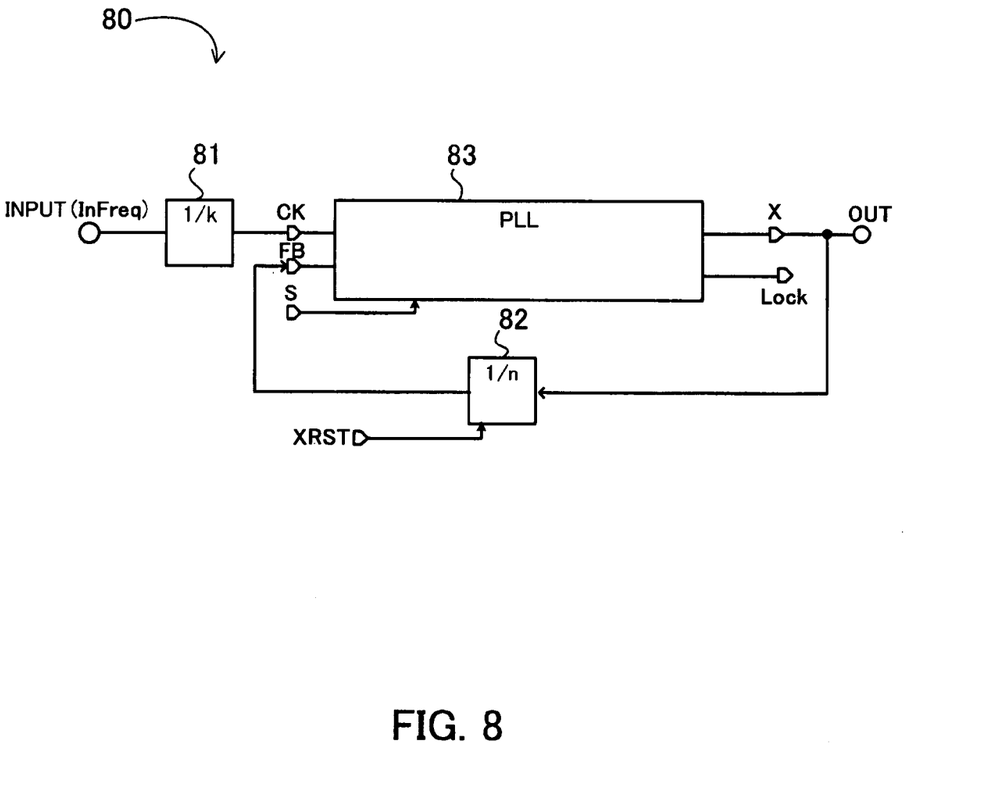
FIG. 8 illustrates a configuration of a general PLL circuit (incorporating no frequency dividing circuit)

FIG. 8 illustrates a configuration of a general PLL circuit (a circuit incorporating no frequency dividing circuit).

A PLL circuit 80 has a 1/k frequency dividing circuit 81, a 1/n frequency dividing circuit 82 and a PLL block 83. Each block is provided as a logic library. During the logic simulation, these blocks are connected with each other.

The 1/k frequency dividing circuit 81 frequency-multiplies a clock signal to an infrequency terminal by 1/k, and supplies a frequency-multiplied clock signal as a reference clock to a CK terminal of the PLL block 83.

The 1/n frequency dividing circuit 82 frequency-multiplies an output clock from an X terminal of the PLL block 83 by 1/n, and supplies a frequency-multiplied output clock as a feedback clock to an FB terminal of the PLL block 83. Further, the 1/n frequency dividing circuit 82 is reset according to a start reset signal supplied to an XRST terminal.

The PLL block 83 receives the reference clock from the CK terminal and, at the same time, receives the feedback clock from the FB terminal. Then, the PLL block 83 outputs from the X terminal the output clock obtained by frequency-multiplying the reference clock by n. The output clock from the X terminal is output from an OUT terminal to circuits outside the PLL circuit 80. The PLL block 83 is started or reset according to a start reset signal supplied to an S terminal. When a rise (or a fall) phase difference between the reference clock and the feedback clock falls within a predetermined range (Lock determination phase difference range), the PLL block 83 outputs a Lock signal indicating a locked state of the PLL block 83 from the Lock terminal.

A PLL block incorporating a frequency dividing circuit is another block generally used as the logic library.

Figure 9:
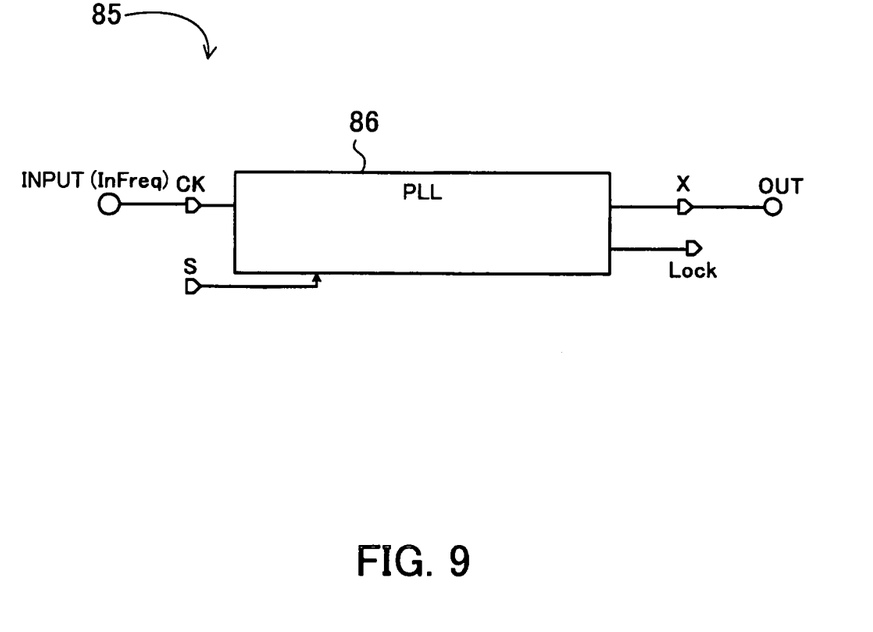
FIG. 9 illustrates a configuration of a PLL circuit incorporating a frequency dividing circuit.

FIG. 9 illustrates a configuration of a PLL circuit incorporating the frequency dividing circuit.

A PLL circuit 85 has a PLL block 86 incorporating the frequency dividing circuits as illustrated in FIG. 8. The PLL block 86 incorporates a feedback loop and therefore has no FB terminal. In the same manner as in FIG. 8, an output clock obtained by frequency-multiplying a reference clock is output from an X terminal, and further output from an OUT terminal to circuits outside the PLL circuit 85.

Figure 10:
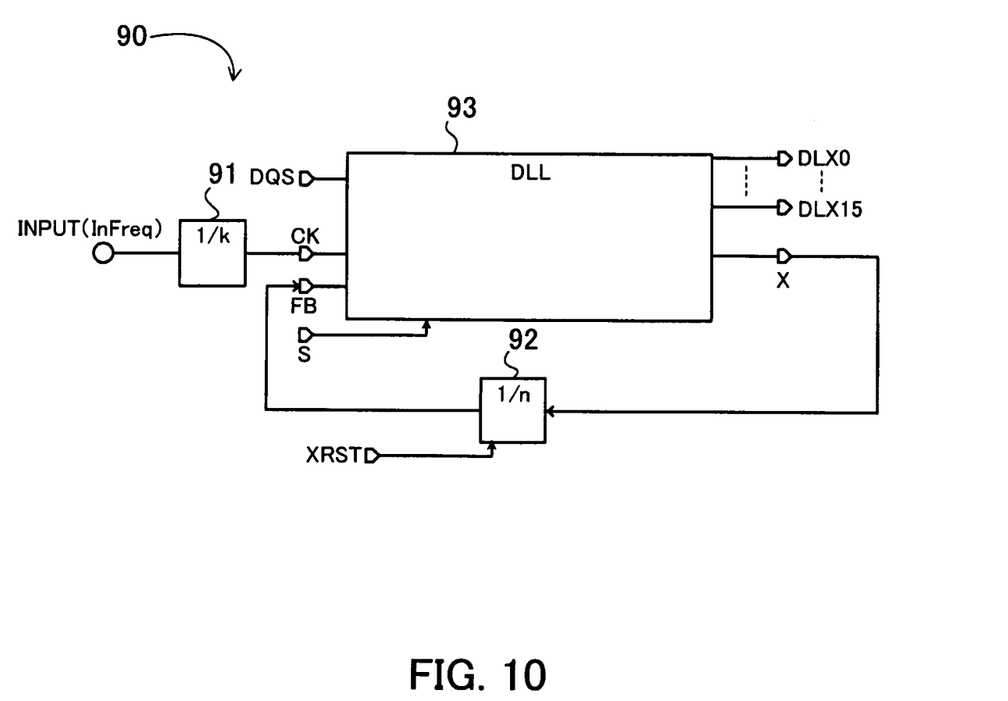
FIG. 10 illustrates a configuration of a general DLL circuit.

FIG. 10 illustrates a configuration of a general DLL circuit.

The DLL circuit 90 has a 1/k frequency dividing circuit 91, a 1/n frequency dividing circuit 92, and a DLL block 93. The 1/k frequency dividing circuit 91 and the 1/n frequency dividing circuit 92 have the same functions as those of the 1/k frequency dividing circuit 81 and 1/n frequency dividing circuit 82 of the PLL circuit 80 in FIG. 8.

The DLL block 93 incorporates the PLL block 83 illustrated in FIG. 8. The DLL block 93 outputs, from terminals DLX0 to DLX15, signals obtained by adjusting a delay amount between a reference clock and a signal (e.g., a data strobe signal of the DDR-SDRAM) supplied from a DQS terminal.

Next, the following will describe one example of an operation in conventional logic verification of a PLL circuit.

Figure 11:
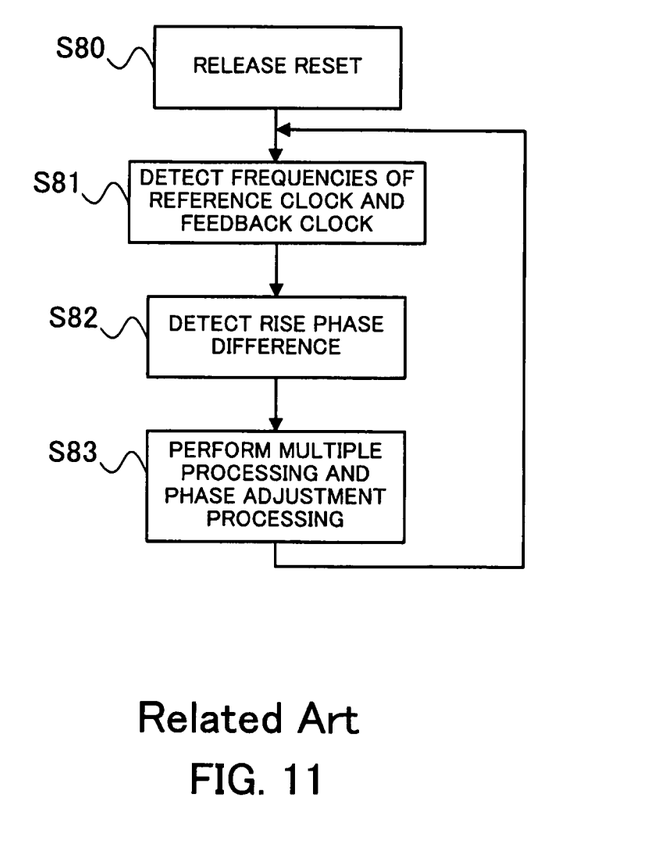
FIG. 11 illustrates a flow of a conventional logic simulation of a PLL circuit.

FIG. 11 illustrates a flow of a conventional logic simulation of the PLL circuit.

First, the PLL circuit 80 as illustrated in FIG. 8 receives from the S terminal a start reset signal for starting the PLL block 83, and releases a reset state of the PLL block 83. Similarly, the PLL circuit 80 receives from an XRST terminal a start reset signal for releasing a reset state of the 1/n frequency dividing circuit 82. Thus, a reset state of the PLL circuit 80 is released, and the operation is started (step S80). When starting the simulation, a peculiar (or specified) minimum oscillation frequency of the PLL block 83 is set as a frequency of the output clock from the X terminal.

Next, the PLL circuit 80 detects a frequency of the reference clock supplied to the CK terminal and, at the same time, detects a frequency of the feedback clock supplied to the FB terminal (step S81).

Then, the PLL circuit 80 detects a rise (or a fall) phase difference between the reference clock and the feedback clock (step S82).

Thereafter, the PLL circuit 80 performs multiple processing and phase adjustment processing based on the detected phase difference (step S83). In the logic simulation of the PLL circuit 80, a minimum oscillation frequency and maximum oscillation frequency, a tilt coefficient, and a Lock determination phase difference range are previously set. Thus, the conventional logic simulation is performed. Specifically, according to the tilt coefficient, the PLL circuit 80 raises or lowers the frequency of the output clock for the detected phase difference between the reference clock and the feedback clock. More specifically, when a phase of the feedback clock is leading that of the reference clock, the PLL circuit 80 recognizes that a frequency of the output clock from the X terminal of the PLL block 83 is high, and performs an operation of lowering the frequency of the output clock.

Conversely, when the phase of the feedback clock delays from that of the reference clock, the PLL circuit 80 recognizes that the frequency of the output clock from the X terminal of the PLL block 83 is low, and performs an operation of raising the frequency of the output clock.

This output clock is again supplied to the FB terminal of the PLL block 83 via the 1/n frequency dividing circuit 82, and the PLL circuit 80 repeats the processes from step S81.

During the processes, when the above-described phase difference between the reference clock and the feedback clock continues to fall within the Lock determination phase difference range as another control parameter, the PLL circuit

80 outputs the Lock signal indicating a locked state of the PLL circuit from the Lock terminal.

The conventional logic simulation method simulates the operation of the PLL circuit 80 as an analog circuit according to the above-described flow.

During the conventional logic simulation, the guaranteed frequency range of the PLL circuit is approximately from 50 to 100 MHz, and the maximum output frequency is approximately 500 MHz.

However, when the conventional logic simulation method verifies the analog circuit such as the PLL circuit or the DLL circuit, the logic operation in the logic simulation does not necessarily match an actual physical operation. In this case, there is a problem that verification errors occur to cause a failure in the actual physical operation.

This problem has become increasingly prominent in recent years where a high-frequency PLL circuit operating over a wide range of frequencies (e.g., 300 to 600 MHz) and operating at a maximum frequency of about 1.6 GHz has been demanded. As a result, the conventional logic simulation method using the tilt coefficient to perform a phase adjustment or multiple function becomes hard to verify the physical operation of the PLL circuit.

SUMMARY

According to an aspect of the embodiments, this logic simulation method includes: causing a physical specification detector to detect physical specifications of an analog circuit as a verification object described in a logic library; causing a monitor to monitor whether a signal or setting during a logic simulation satisfies the physical specifications; and causing a warning section to issue a warning when the signal or the setting fails to satisfy the physical specifications.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Embodiments of the present invention will be described in detail below with reference to the accompanying drawings, wherein like reference numerals refer to like elements throughout.

Figure 1:
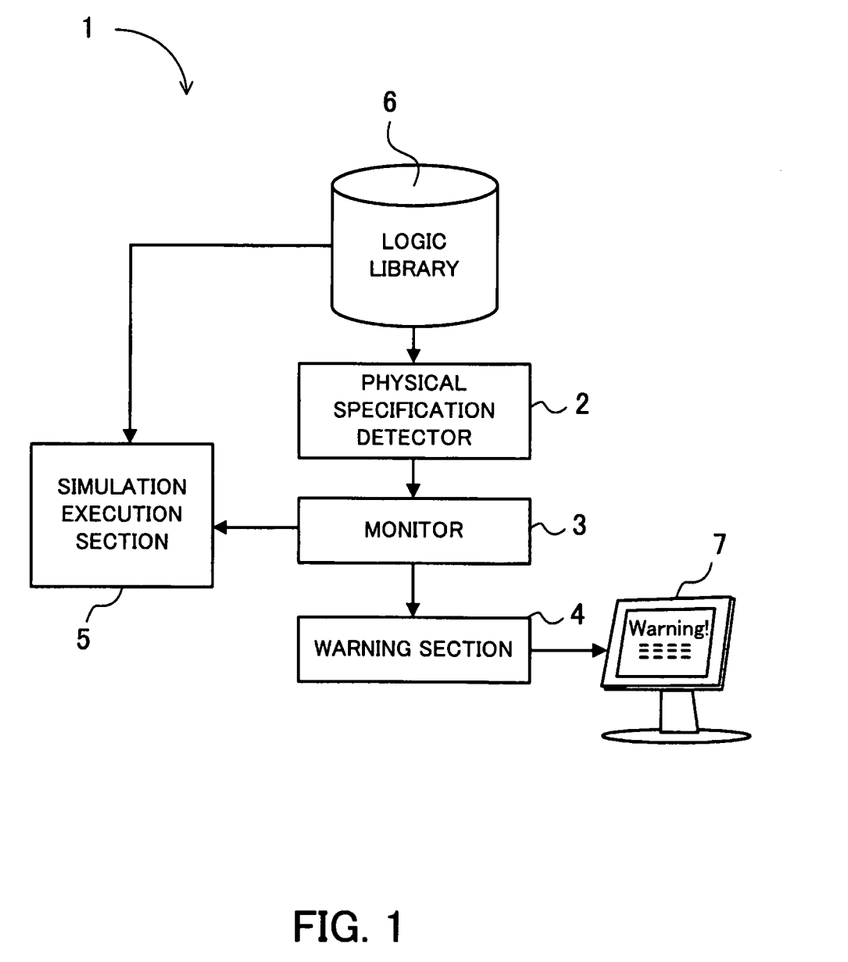
FIG. 1 outlines a logic simulator according to the present embodiment.

FIG. 1 outlines a logic simulator according to the present embodiment.

A logic simulator 1 has a physical specification detector 2, a monitor 3, a warning section 4, and a simulation execution section 5.

The physical specification detector 2 detects physical specifications of an analog circuit as a verification object described in a logic library 6.

The physical specifications include a starting sequence indicating a setting of a signal to be supplied when starting an analog circuit such as a PLL circuit or a DLL circuit, a pulse width (an H (high) level pulse width and an L (low) level pulse width) of a start reset signal for starting or resetting PLL blocks or frequency dividing circuits as illustrated in FIGS. 8 and 9, an allowable frequency range (specified by a minimum frequency and a maximum frequency) of each clock, a lock-up time, and a phase difference viewed as a lock between a reference clock and a feedback clock (described in detail below).

The monitor 3 monitors whether a signal or setting during the logic simulation satisfies the physical specifications. Examples of the signal or setting during the logic simulation include the above-described starting sequence, each clock, lock-up time, and phase difference viewed as a lock.

The warning section 4 displays a warning, for example, on a display 7 when the signal or setting during the logic simulation fails to satisfy the physical specifications.

The simulation execution section 5 executes the logic simulation of the analog circuit based on descriptions of the logic library 6.

The logic library 6 describes a logic operation of the analog circuit, and physical specifications to be satisfied by the analog circuit as a verification object.

Hereinafter, an operation of the logic simulator 1 will be outlined.

When the simulation execution section 5 executes the logic simulation of the analog circuit based on the description of the logic library 6, the physical specification detector 2 detects the physical specifications described in the logic library 6 and the monitor 3 monitors whether the signal or setting during the logic simulation satisfies the physical specifications.

Here, for example, when the monitor 3 detects a clock that fails to satisfy an allowable frequency range or pulse width of each clock specified in the physical specifications, detects the setting different from that of the starting sequence of the physical specifications, or detects the setting of a lock function different from that of the physical specifications, the warning section 4 issues a warning. This warning makes it possible for users to pay attention to simply detect inputting errors or usage errors, so that verification errors can be prevented.

Next, the present embodiment will be described in detail.

The logic simulation method according to the present embodiment is performed, for example, by the following computer.

Figure 2:
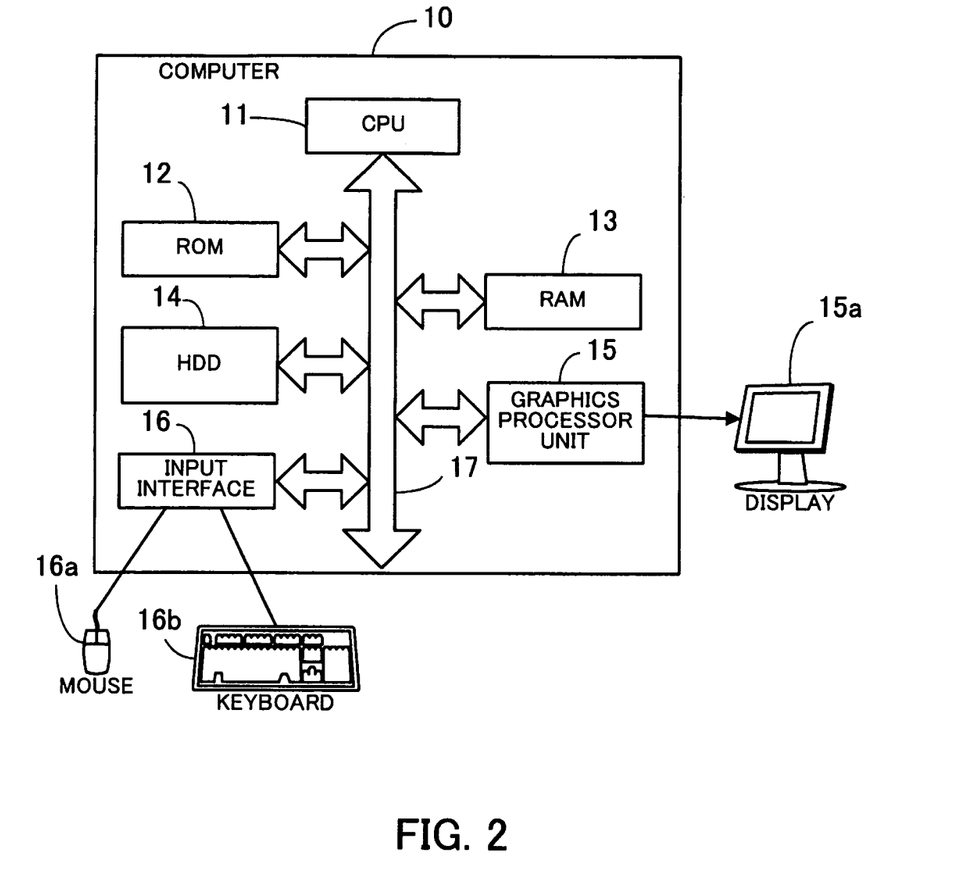
FIG. 2 illustrates a hardware configuration of a computer.

FIG. 2 illustrates a hardware configuration of the computer.

A computer 10 includes a CPU (Central Processing Unit) 11, a ROM (Read Only Memory) 12, a RAM (Random Access Memory) 13, an HDD (Hard Disk Drive) 14, a graphics processor unit 15, and an input interface 16, and these are connected via a bus 17.

Here, the CPU 11 controls each section according to programs stored in the ROM 12 and the HDD 14, the logic library 6 as illustrated in FIG. 1, or various types of data, thereby performing the functions of the physical specification detector 2, monitor 3, warning section 4, and simulation execution section 5 illustrated in FIG. 1.

The ROM 12 stores fundamental programs or data executed by the CPU 11.

The RAM 13 stores a program or data in execution by the CPU 11.

The HDD 14 stores OS (Operating System), logic library, logic simulator program, various types of application programs, or various types of data executed by the CPU 11.

To the graphics processor 15, for example, a display 15a is connected as a display unit. The graphics processor 15 causes statuses of the logic simulation or the above-described warnings to be displayed on the display 15a according to drawing instructions from the CPU 11.

To the input interface 16, input devices such as a mouse 16a and a keyboard 16b are connected, thereby receiving information input by users and transmitting the information to the CPU 11 via the bus 17.

With the above-described configuration, the respective functions of the logic simulator 1 as illustrated in FIG. 1 are realized.

Figure 3:
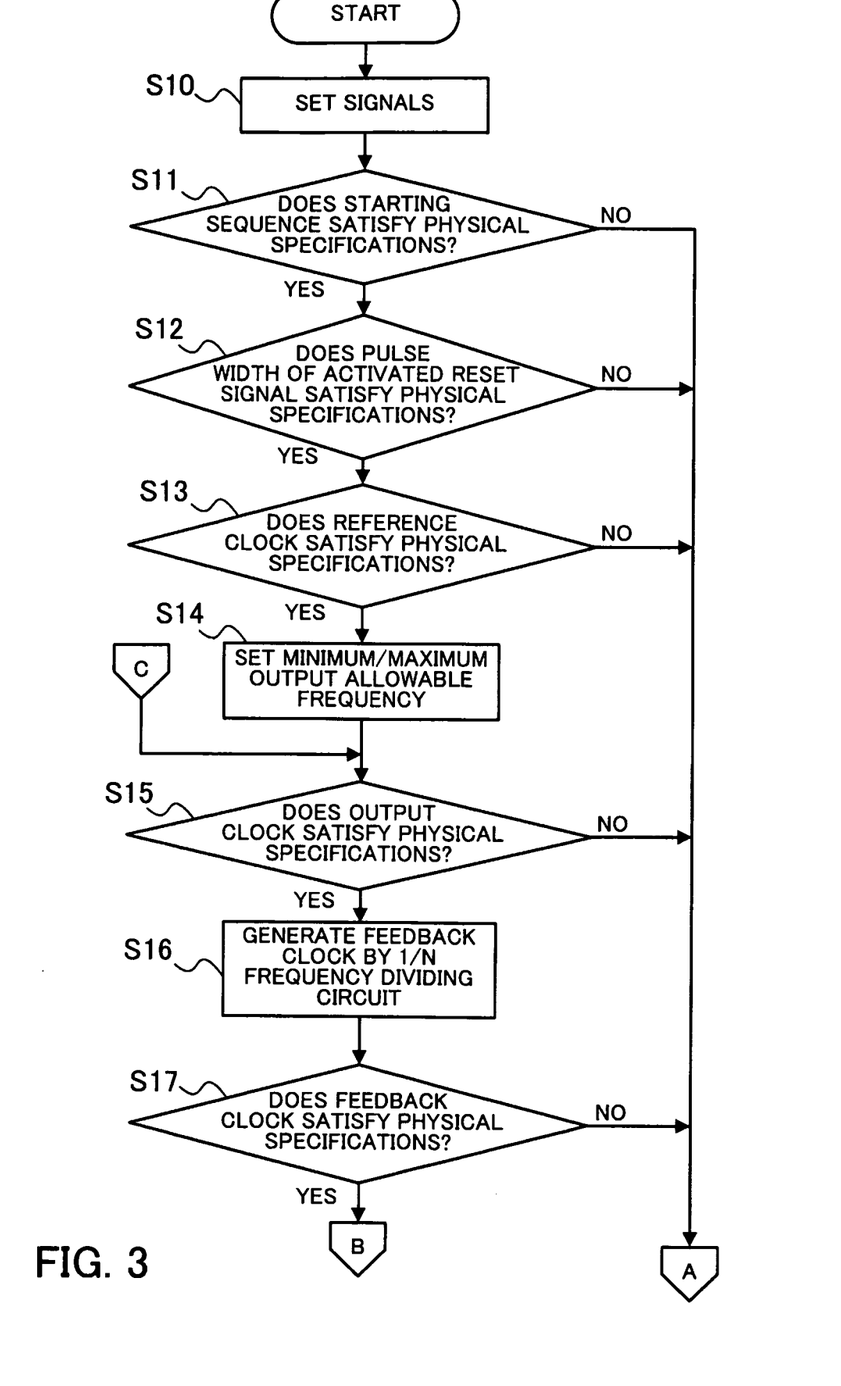
FIG. 3 is a flowchart illustrating a flow of a logic simulation method according to the present embodiment (part one)
Figure 4:
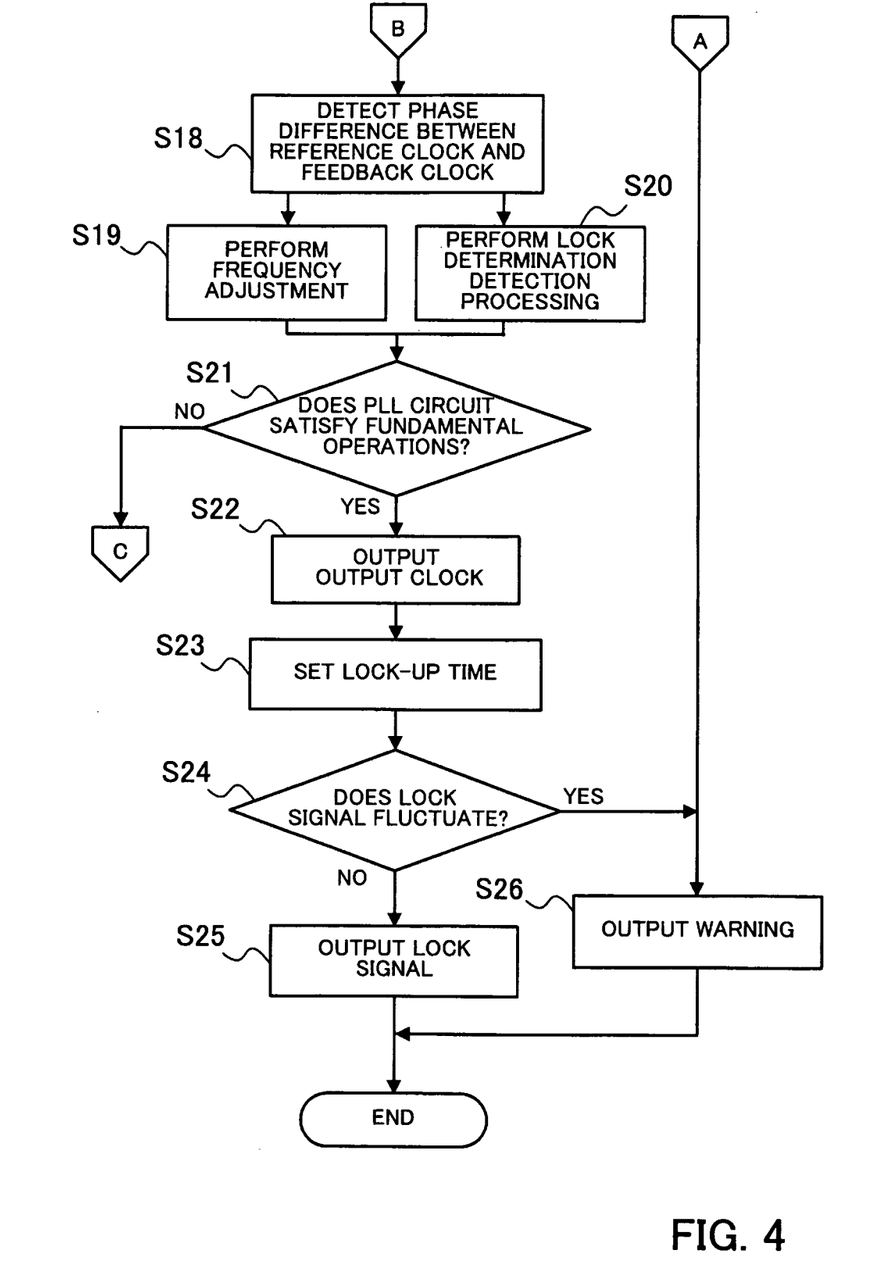
FIG. 4 is a flowchart illustrating a flow of a logic simulation method according to the present embodiment (part two)

FIGS. 3 and 4 are a combined flowchart illustrating a flow of the logic simulation method according to the present embodiment. Hereinafter, a description will be made by taking as an example a case of performing the logic simulation of the PLL circuit. Further, a description will be made on a case of using as the logic library of the PLL block a logic library of a PLL block incorporating no frequency dividing circuit as illustrated in FIG. 8.

When running the logic simulator program stored, for example, in the HDD 14 to start the logic simulation, the user sets various signals using the mouse 16a or keyboard 16b as illustrated in FIG. 2 (step S10).

Setting signals include the start reset signals for the PLL block and the frequency dividing circuit, and initial values of the reference clock and the feedback clock.

When signals are set, the CPU 11 detects the physical specifications described in the logic library to perform the following process.

At first, the CPU 11 monitors the starting sequence, and determines whether the starting sequence satisfies the physical specifications (step S11).

In the PLL circuit, for example, an order of release of the reset and that of setting of the feedback clock, and an order of release of the reset of the 1/n frequency dividing circuit and that of the PLL block may be determined by an electrical physical specification. There is a possibility that when this order is not followed, a defect occurs during an actual physical operation. Therefore, the starting sequence previously determined by the physical specifications is described in the logic library. The CPU 11 monitors signals set at the time of starting the logic simulation and determines whether an order of the signals set by the user is followed according to the starting sequence.

When the CPU 11 here determines that the order is not followed according to the starting sequence, the warning section 4 issues a warning (step S26). The warning is issued to the user as follows. For example, under the control of the CPU 11, the graphics processor unit 15 displays on the display 15a the effect that the order of the release of the reset is not followed according to the starting sequence of the physical specifications. In addition, as for the warning, an alarm may be sounded.

This warning enables the user to understand that he or she has set a wrong starting sequence. The user corrects and changes the starting sequence at a stage of the logic simulation, thereby preventing the verification errors.

Next, the CPU 11 determines whether a set pulse width of the start reset signal satisfies the physical specifications (step S12).

An H width (an H level pulse width) and L width (an L level pulse width) of a pulse of the start reset signal supplied to the 1/n frequency dividing circuit or the PLL block are determined based on the electrical physical specifications. When the above-described pulse widths fail to satisfy the physical specifications, the PLL circuit does not recognize a reset or a reset release not to operate at the time of actually operating the PLL circuit. Therefore, it is necessary for the pulse to have a pulse width of a certain fixed period. The CPU 11 monitors the set pulse width of the start reset signal and determines whether the pulse width of the start reset signal satisfies the physical specifications described in the logic library. If NO, the warning section 4 issues a warning as described above.

The CPU 11 further determines whether the set reference clock satisfies the physical specifications (step S13).

For the purpose of realizing the performance and function of the PLL circuit, a frequency of the reference clock is limited by the electrical physical specifications. When the user follows this specification, the PLL circuit can realize original phase adjustment and multiple functions. Therefore, the CPU 11 monitors the reference clock and determines whether the reference clock satisfies the physical specifications described in the logic library.

The physical specifications on the reference clock for assuring a stable operation of the PLL circuit include a minimum input allowable frequency, a maximum input allowable frequency, a minimum duty width of an H level pulse and an L level pulse, and an inhibition of change in an input frequency in execution of the simulation or that of stoppage of the reference clock. If the reference clock fails to satisfy the physical specifications, the warning section 4 issues a warning as described above.

Next, the user sets a minimum/maximum output allowable frequency of the PLL circuit (step S14).

The CPU 11 determines whether the output clock of the PLL circuit satisfies the physical specifications (step S15).

For the purpose of realizing the performance and function of the PLL circuit, an output frequency of the output clock is limited by the electrical physical specifications. When the user follows this specification, the PLL circuit can realize original phase adjustment and multiple functions. Therefore, the CPU 11 monitors the output clock and determines whether the output clock satisfies the physical specifications described in the logic library.

The physical specifications on the output clock for assuring a stable operation of the PLL circuit include the minimum output allowable frequency and the maximum output allowable frequency. When the output clock fails to satisfy the physical specifications, the warning section 4 issues a warning as described above.

Next, for the purpose of realizing the multiple function, the CPU 11 generates the feedback clock to be supplied to the FB terminal of the PLL block based on the logic library of the 1/n frequency dividing circuit as illustrated in FIG. 8 (step S16). Then, the CPU 11 determines whether the feedback clock satisfies the physical specifications (step S17).

When the 1/n frequency dividing circuit is provided by the logic library different from that of the PLL block, the various feedback clocks may be supplied to the FB terminal due to the configuration of the 1/n frequency dividing circuit. Therefore, in the same manner as in the reference clock, the CPU 11 monitors the feedback clock and determines whether the feedback clock satisfies the physical specifications described in the logic library of the PLL block. When calculating a frequency after the lock between the output clock and the feedback clock, the CPU 11 can determine also whether the multiple function can be realized.

The physical specifications on the feedback clock include the minimum input allowable frequency, the maximum input allowable frequency, the minimum duty width, the inhibition of change in an input frequency in execution of the simulation or that of stoppage of the reference clock, and the allowable multiple setting range (specified by a minimum multiple and a maximum multiple). If the feedback clock fails to satisfy the above-described physical specifications, the warning section 4 issues a warning as described above.

Next, the CPU 11 detects a phase difference (a phase error time of the rise (or the fall)) between the reference clock and the feedback clock (step S18), and performs the frequency adjustment (step S19).

As for the frequency adjustment, based on the reference clock and the output clock, the CPU 11 first detects whether an intended frequency of a multiple n is obtained. When deviating from the intended frequency, the obtained frequency is adjusted as follows. That is, a value obtained by multiplying the above-described phase error time detected in step S18 by 0.5 is added to or subtracted from the detected cycle time of the output clock to be approximated to the intended frequency (the cycle time).

Then, the CPU 11 performs the Lock determination detection processing (step S20). The CPU 11 here determines whether the phase difference detected in step S18 falls within a predetermined range viewed as the lock, as the physical specifications described in the logic library. Then, the CPU 11 determines whether the PLL circuit satisfies fundamental operations (step S21). Specifically, the CPU 11 determines whether as a result of the frequency adjustment in step S19, a frequency of the output clock becomes equal to the intended frequency of the multiple n, and the phase difference falls within a predetermined range viewed as the lock. If NO, the CPU 11 repeats processes from step S15.

When the PLL circuit satisfies the fundamental operation, the CPU 11 outputs the output clock obtained by frequency-multiplying the reference clock by n from the OUT terminal of the PLL circuit, and displays on the display 15*a* that the PLL circuit performs the fundamental operation, thereby causing the user to recognize the above (step S22). The CPU 11 sets the lock-up time based on the physical specifications described in the logic library (step S23). Further, the CPU 11 makes the time of, for example, 100 µsec indefinite according to the physical specifications. The CPU 11 monitors the Lock signal and detects whether the Lock signal fluctuates. If YES, the warning section 4 issues a warning as described above. If NO, the CPU 11 outputs the Lock signal (e.g., a signal with an H level) indicating that the PLL circuit is locked from the Lock terminal of the PLL circuit, and displays on the display 15*a* that the PLL circuit is locked, thereby causing the user to recognize the above (step S25).

The logic simulation method described in FIGS. 3 and 4 is performed using the logic library of the PLL block incorporating no frequency dividing circuit. Also when using the logic library of the PLL block that incorporates the frequency dividing circuit and that has the multiple function as illustrated in FIG. 9, the logic simulation method can be performed approximately in the same manner as in the above-described case. Note, however, that since the PLL block incorporating the frequency dividing circuit internally generates the feedback clock, the process of step S16 is now unnecessary.

The following illustrates examples of the physical specifications described in the logic library and those of warning display processings.

Figure 5:
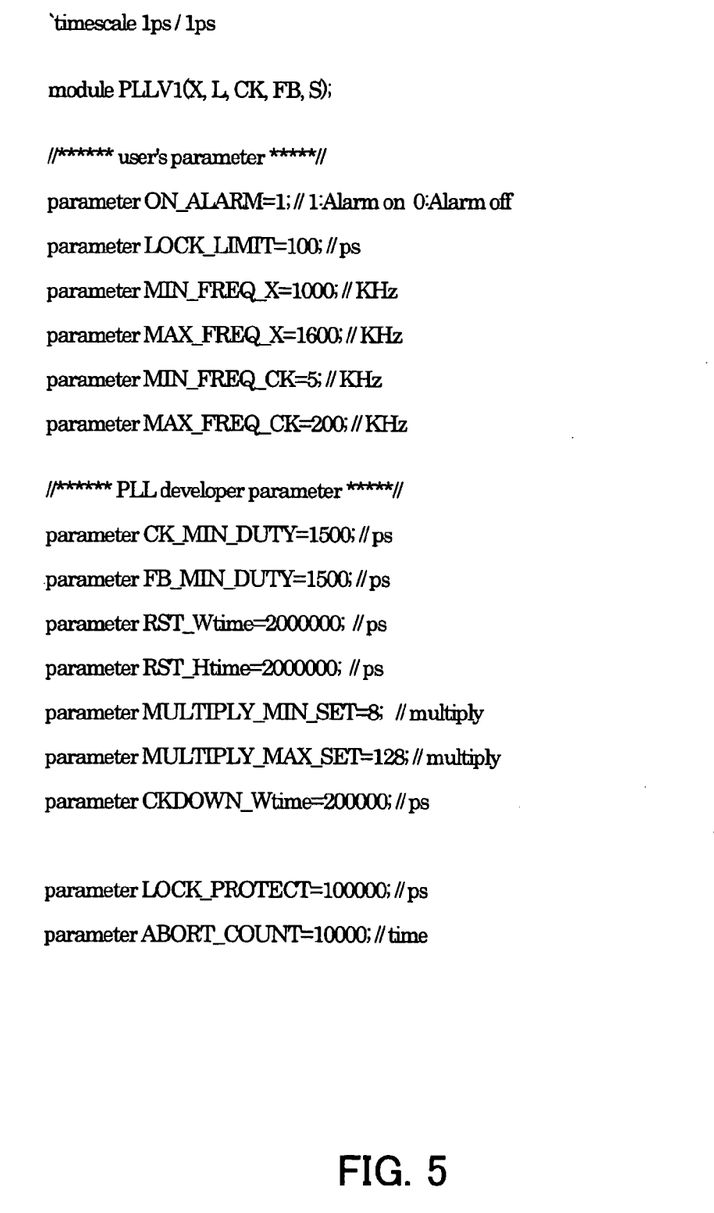
FIG. 5 illustrates examples of physical specifications described in a logic library.

FIG. 5 illustrates examples of the physical specifications described in the logic library.

As in FIG. 5, the physical specifications such as an allowable frequency of various clocks, a minimum duty width, a pulse width necessary for the start reset signal, an allowable multiple setting range, and a lock-up time are described as a "parameter".

Here, the physical specifications are described using Verilog; however, it is not limited thereto. The physical specifications may be described using the hardware description language such as System C. The same goes hereinafter too.

Figure 6:
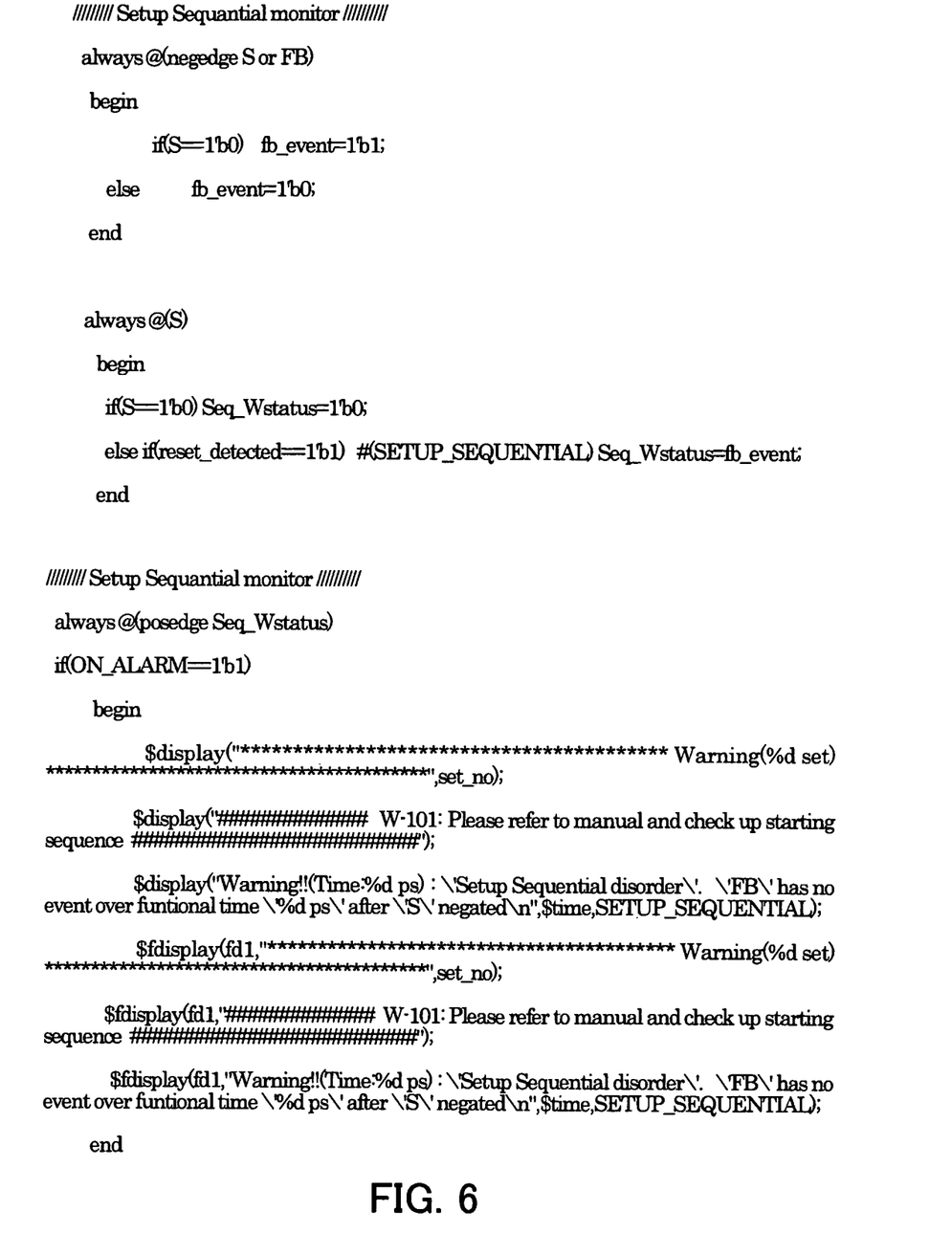
FIG. 6 illustrates examples of physical specifications in a starting sequence and those of warning display processings described in the logic library.

FIG. 6 illustrates examples of the physical specifications of the starting sequence described in the logic library and those of the warning display processings.

Here, an order of the start reset signal S in the starting sequence and that of the feedback clock FB are specified. When these orders are not satisfied, a warning status "Seq_W-status" of the starting sequence is launched to display the warning.

Figure 7:
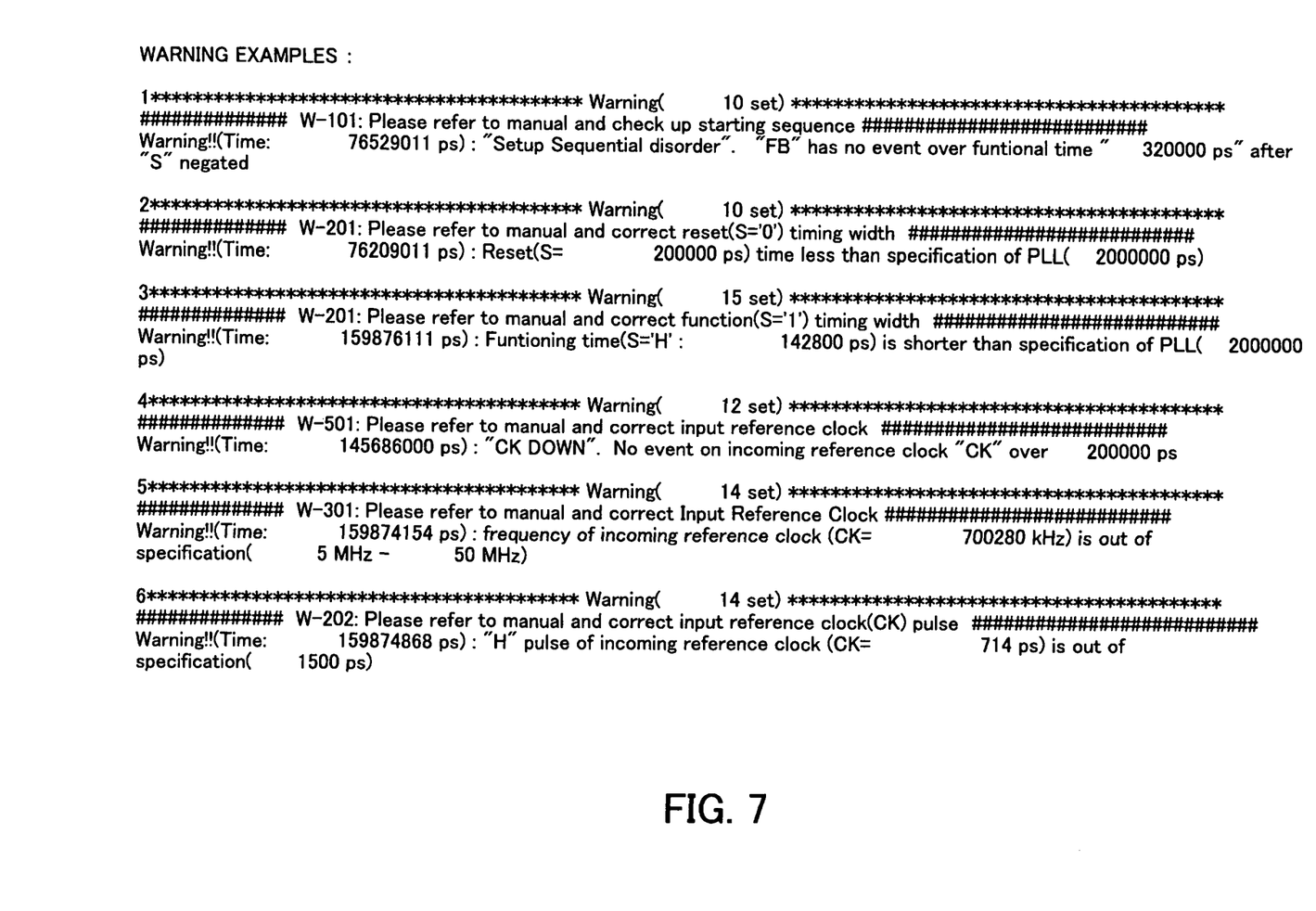
FIG. 7 illustrates examples of warning display processings.

FIG. 7 illustrates examples of the warning display processings.

The warning screen is displayed according to the warning display processings as illustrated in FIG. 6. Here, FIG. 7 illustrates examples of the warning display processings such as a setting error of the starting sequence, and a case where a pulse width of the start reset signal or a frequency of the reference clock is out of the allowable range.

As described above, using the logic simulation method according to the present embodiment, the simulation corresponding to actual physical operations in the PLL circuit as an analog circuit can be performed based on the physical specifications described in the logic library. Therefore, the verification errors due to a difference between the logic operation and the physical operation can be easily prevented.

Further, since inputting errors and setting errors can be detected at an upstream design process, an effect capable of largely reducing the readjusting man-hour can be expected. Regardless of a skill of designers, since an error is monitored on the logic simulator side, the logic simulation can be performed with constant quality.

It should be further understood by those skilled in the art that although the foregoing description has been made on embodiments of the invention, the invention is not limited thereto and various changes and modifications may be made without departing from the spirit of the invention and the scope of the appended claims.

For example, the PLL circuit is described above; further, the present embodiment is applicable similarly to the DLL circuit incorporating the PLL circuit, and other analog circuits.

In the present embodiment, the setting or signal during the logic simulation of the analog circuit is monitored. When the setting or signal fails to satisfy the physical specifications, the warning is issued. Therefore, this warning makes it possible for users to pay attention to simply detect inputting errors or usage errors, so that verification errors can be prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that various changes, substitutions and alterations could be made hereto without departing from the spirit and scope of the invention.

What is claimed is:

1. A logic simulation method executed by a processor, the method comprising:

causing a physical specification detector to detect physical specifications of an analog circuit which is one of a PLL circuit incorporating a 1/n frequency dividing circuit and a DLL circuit incorporating the PLL circuit as a verification object described in a logic library stored in a memory;

causing a monitor to monitor whether, during a logic simulation, a start reset signal, an order in which a release of a reset state of the PLL circuit or the DLL circuit and a setting of a feedback clock are to be performed, or an order in which a release of a reset state of the 1/n frequency dividing circuit and a release of a reset state of the PLL circuit or the DLL circuit are to be performed satisfies the physical specifications or not; and causing a warning section to issue a warning when the start reset signal, the order in which the release of the reset state of the PLL circuit or the DLL circuit and the setting of the feedback clock are to be performed, or the order in which the release of the reset state of the 1/n frequency dividing circuit and the release of the reset state of the PLL circuit or the DLL circuit are to be performed fails to satisfy the physical specifications, wherein:

the physical specifications include a starting sequence indicating an order in which the release of the reset state of the PLL circuit or the DLL circuit and the setting of the feedback clock are to be performed, or an order in which the release of the reset state of the 1/n frequency dividing circuit and the release of the reset state of the PLL circuit or the DLL circuit are to be performed when the analog circuit is started and a pulse width of the start reset signal to be supplied when the analog circuit is started or reset; and when the monitor detects that the order in which the release of the reset state of the PLL circuit or the DLL circuit and the setting of the feedback clock are to be performed, or the order in which the release of the reset state of the 1/n frequency dividing circuit and the release of the reset state of the PLL circuit or the DLL circuit are to be performed fails to satisfy the starting sequence, the warning section issues the warning; and when the monitor detects that the start reset signal fails to satisfy the pulse width defined by the physical specifications during the logic simulation, the warning section issues the warning.

2. The logic simulation method according to claim 1, wherein the physical specifications include specifications of a output clock or lock function of one of the PLL circuit and the DLL circuit.

3. The logic simulation method according to claim 2, wherein the specifications include one of an allowable frequency range and a minimum duty width.

4. The logic simulation method according to claim 2, wherein the specifications include an allowable multiple setting range.

5. The logic simulation method according to claim 2, wherein the specifications of the lock function include one of a lock-up time and a phase difference viewed as a lock between the reference clock and the feedback clock.

6. The logic simulation method according to claim 1, further comprising:

causing a frequency adjustment section to perform a frequency adjustment so as to approximate a cycle time of a target frequency by adding to or subtracting from a cycle time of an output clock a value obtained by multiplying a phase error time by 0.5, the phase error time being a phase difference between the reference clock and the feedback clock of one of the PLL circuit or the DLL circuit.

7. A logic simulator, comprising:

a physical specification detector that detects physical specifications of an analog circuit which is one of a PLL circuit incorporating a 1/n frequency dividing circuit and a DLL circuit incorporating the PLL circuit as a verification object described in a logic library;

a monitor that monitors whether, during a logic simulation, a start reset signal, an order in which a release of a reset state of the PLL circuit or the DLL circuit and a setting of a feedback clock are to be performed, or an order in which a release of a reset state of the 1/n frequency dividing circuit and a release of a reset state of the PLL circuit or the DLL circuit are to be performed satisfies the physical specifications or not; and a warning section that issues a warning when the start reset signal, the order in which the release of the reset state of the PLL circuit or the DLL circuit and the setting of the feedback clock are to be performed, or the order in which the release of the reset state of the 1/n frequency dividing circuit and the release of the reset state of the PLL circuit or the DLL circuit are to be performed fails to satisfy the physical specifications, wherein:

the physical specifications include a starting sequence indicating an order in which the release of the reset state of the PLL circuit or the DLL circuit and the setting of the feedback clock are to be performed, or an order in which the release of the reset state of the 1/n frequency dividing circuit and the release of the reset state of the PLL circuit or the DLL circuit are to be performed when the analog circuit is started and a pulse width of the start reset signal to be supplied when the analog circuit is started or reset; and when the monitor detects that the order in which the release of the reset state of the PLL circuit or the DLL circuit and the setting of the feedback clock are to be performed, or the order in which the release of the reset state of the 1/n frequency dividing circuit and the release of the reset state of the PLL circuit or the DLL circuit are to be performed fails to satisfy the starting sequence, the warning section issues the warning; and when the monitor detects that the start reset signal fails to satisfy the pulse width defined by the physical specifications during the logic simulation, the warning section issues the warning.

8. The logic simulation method according to claim 1, wherein one of the PLL circuit and the DLL circuit has a maximum output frequency of 1.6 GHz or higher and a guaranteed frequency ranging from 300 to 600 MHz.

9. The logic simulator according to claim 7 wherein one of the PLL circuit and the DLL circuit has a maximum output frequency of 1.6 GHz or higher and a guaranteed frequency ranging from 300 to 600 MHz.

* * * * *